(12) United States Patent
Montena

(10) Patent No.: US 7,323,951 B2
(45) Date of Patent: Jan. 29, 2008

(54) CASING FOR CATV FILTER

(75) Inventor: Noah Montena, Syracuse, NY (US)

(73) Assignee: John Mezzalinqua Associates, Inc., East Syracuse, NY (US)

( * ) Notice: Subject to any disclaimer, the term of this patent is extended or adjusted under 35 U.S.C. 154(b) by 57 days.

(21) Appl. No.: 11/180,758

(22) Filed: Jul. 13, 2005

(65) Prior Publication Data

US 2007/0013461 A1 Jan. 18, 2007

(51) Int. Cl.
*H03H 7/01* (2006.01)
(52) U.S. Cl. .................................. 333/175; 333/185
(58) Field of Classification Search ............... 333/175, 333/176, 185
See application file for complete search history.

(56) References Cited

U.S. PATENT DOCUMENTS

| | | | |
|---|---|---|---|
| 4,701,726 A | 10/1987 | Holdsworth | |
| 6,165,019 A | 12/2000 | Kha et al. | |
| 6,323,743 B1 | 11/2001 | Zelenz et al. | |
| 6,476,688 B2 * | 11/2002 | Palinkas | 333/175 |
| 6,636,129 B2 | 10/2003 | Zennamo, Jr. et al. | |
| 6,674,342 B2 | 1/2004 | Zennamo, Jr. et al. | |
| 6,794,957 B2 | 9/2004 | Shafer et al. | |
| 2003/0090340 A1 | 5/2003 | Chen | |
| 2003/0151470 A1 | 8/2003 | Zennamo, Jr. et al. | |
| 2004/0227589 A1 | 11/2004 | Panetta et al. | |

* cited by examiner

*Primary Examiner*—Benny Lee
(74) *Attorney, Agent, or Firm*—Christopher R. Pastel; Pastel Law Firm

(57) ABSTRACT

A filter for CATV applications includes a housing and two interface caps, each with an annular groove in a header portion thereof. A circuit board having a grounding bus along an edge of the board is disposed inside the housing. A split ring grounding clamp is disposed inside the housing such that a plurality of split rings are adjacent the grounding bus. The interface caps are press fitted into the ends of the housing, forcing the plurality of split rings into uniform contact with the grounding bus. The ends of the housing are then crimp-rolled such that a ridge is formed in the housing where the grooves in the headers are located in the interface caps, thereby sealing the ends of the housing to the interface caps.

4 Claims, 3 Drawing Sheets

CASING FOR CATV FILTER

FIELD OF THE INVENTION

This invention relates generally to the field of cable TV (CATV) filters, and more particularly to a filter casing which incorporates a split ring grounding clamp.

BACKGROUND OF THE INVENTION

U.S. Pat. No. 6,794,957 discloses a cable TV (CATV) filter assembly with improved electrical grounding. In particular, the printed circuit board inside the filter has grounding busses on its edges. Solder bumps on the filter housing form a friction fit with the grounding busses. Unfortunately, the friction fit is not uniform along the length of the busses. The non-uniform mechanical contact causes variations in the quality of the ground contact.

SUMMARY OF THE INVENTION

Briefly stated, a filter for CATV applications includes a housing and two interface caps, each with an annular groove in a header portion thereof. A circuit board having a grounding bus along an edge of the board is disposed inside the housing. A split ring grounding clamp is disposed inside the housing such that a plurality of split rings are adjacent the grounding bus. The interface caps are press fitted into the ends of the housing, forcing the plurality of split rings into uniform contact with the grounding bus. The ends of the housing are then crimp-rolled such that a ridge is formed in the housing where the grooves in the headers are located in the interface caps, thereby sealing the ends of the housing to the interface caps.

According to an embodiment of the invention, a filter for CATV applications includes a housing; at least a first interface cap connected to an end of the housing; a circuit board inside the housing; at least a first grounding bus along a first top edge of the circuit board; and an electrically conductive split ring grounding clamp inside the housing clamping at least a portion of the first grounding bus, thereby making electrical contact between the first grounding bus and the housing.

According to an embodiment of the invention, a filter for CATV applications includes a housing; first and second interface caps connected at each end of the housing; a circuit board disposed inside the housing; at least a first grounding bus along a top edge of the circuit board; and clamping means inside the housing clamping at least a portion of the first grounding bus, thereby making electrical contact between the first grounding bus and the housing.

According to an embodiment of the invention, a method for making a filter for CATV applications includes the steps of (a) providing a housing; (b) providing first and second interface caps, each with an annular groove in a header portion thereof; (c) positioning a circuit board inside the housing, wherein the circuit board includes at least a first grounding bus along a top edge of the circuit board; (d) positioning an electrically conductive split ring grounding clamp inside the housing such that a plurality of split rings are adjacent the first grounding bus; (e) press fitting the first and second interface caps into first and second ends of the housing, respectively, thereby forcing the plurality of split rings of the split ring grounding clamp into uniform contact with the first grounding bus; and (f) crimp rolling the first and second ends of the housing such that a ridge is formed in the housing where the grooves in the headers are located in the first and second interface caps, thereby sealing the first and second ends of the housing to the first and second interface caps, respectively.

DETAILED DESCRIPTION OF THE PREFERRED EMBODIMENT

Figure 1:
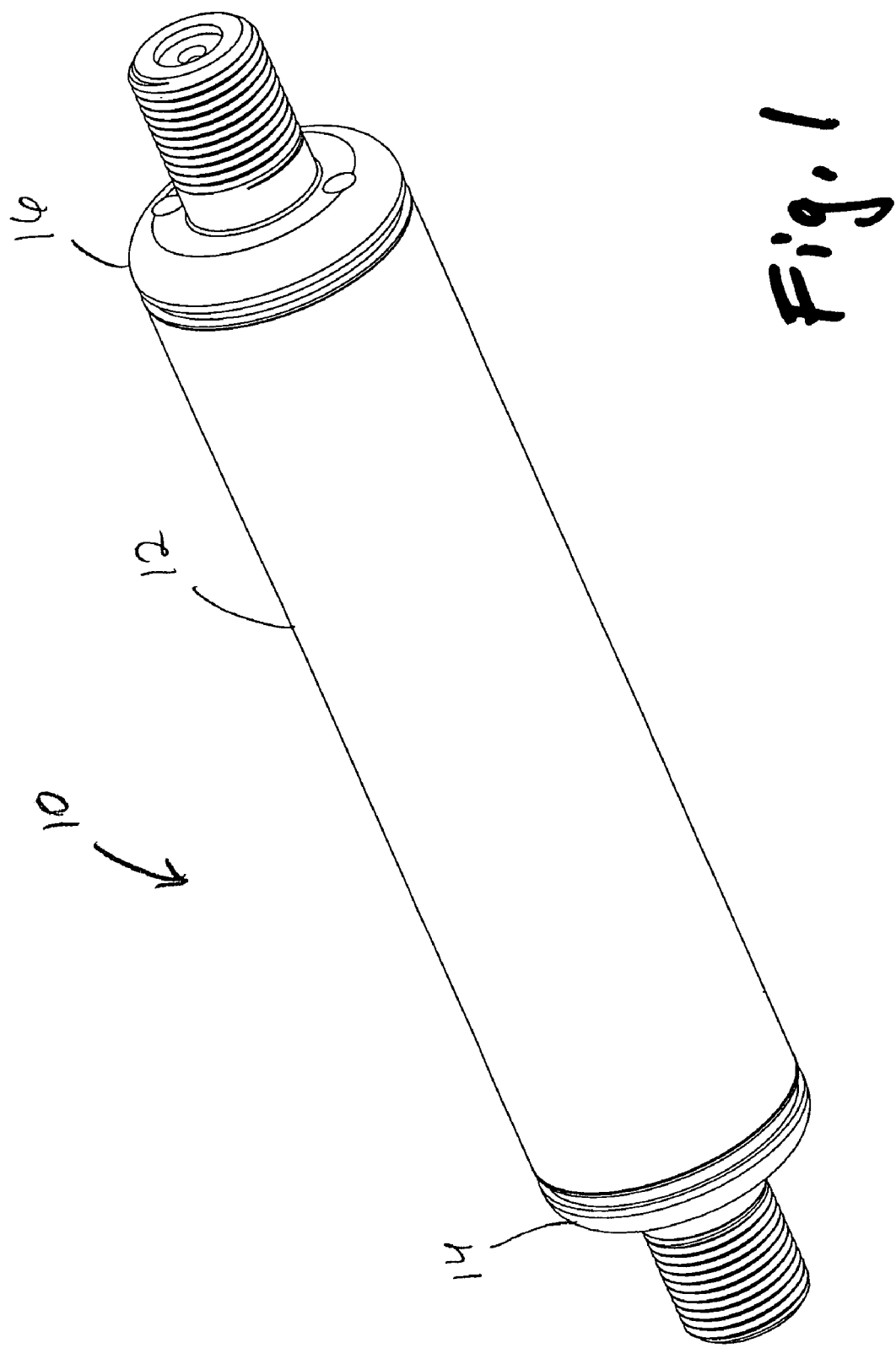
FIG. 1 shows a perspective external view of a filter according to an embodiment of the invention.

Referring to FIG. 1, a cable TV (CATV) filter 10 includes a housing 12 with a first end 14 and a second end 16 connected to housing 12. First interface cap 14 and second interface cap 16 can be of any type connector compatible with the equipment, ports, or other connectors to which filter 10 is to be connected.

Figure 2:
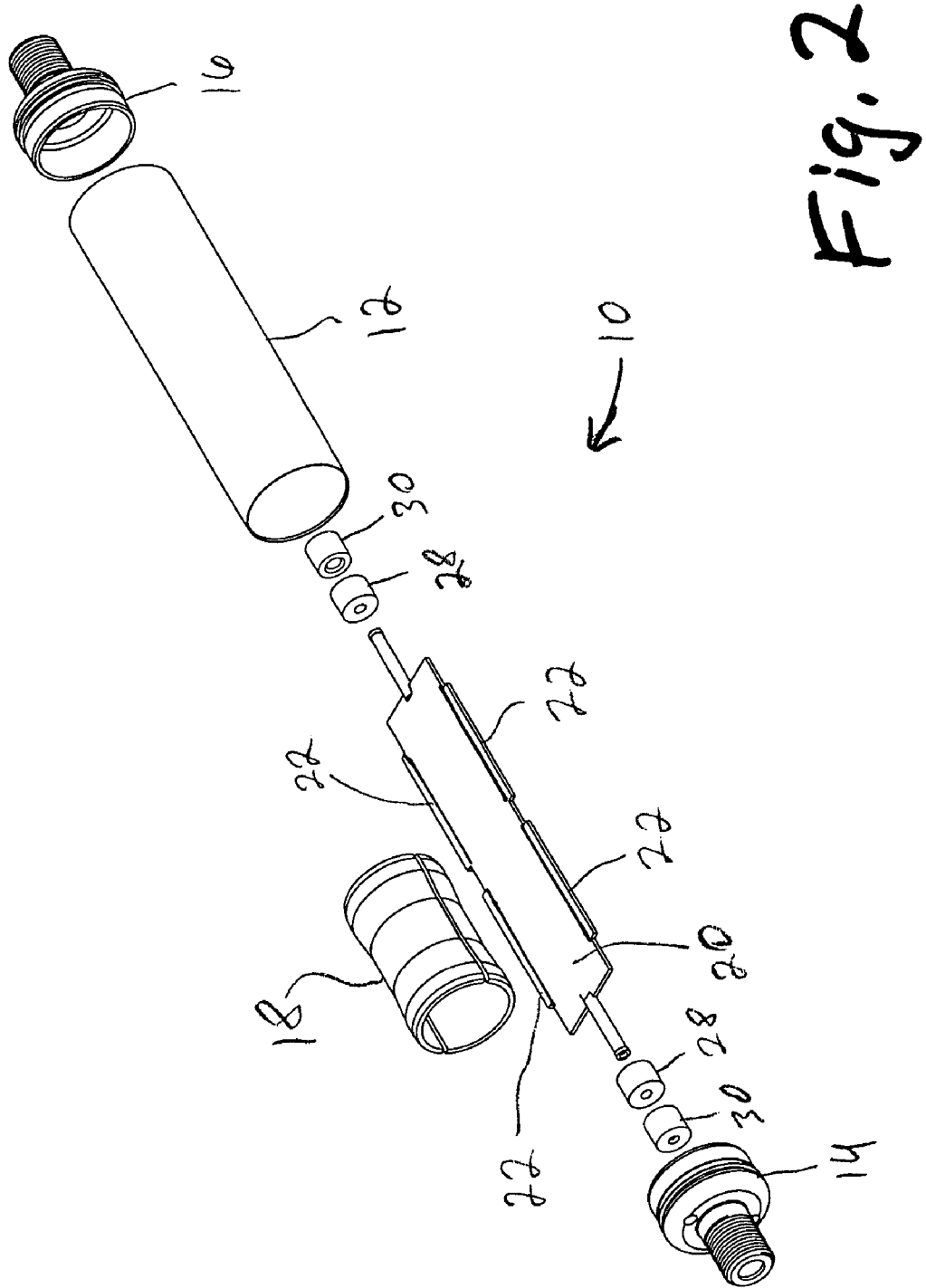
FIG. 2 shows an exploded perspective view of the embodiment of FIG. 1.

Referring to FIG. 2, filter 10 also includes a circuit board 20, preferably a printed circuit board, rubber seals 28 (see also FIG. 3), and insulators 30 (see also FIG. 3) to keep the electrical components of circuit board 20 properly aligned within housing 12 and first and second interface caps 14, 16. Circuit board 20 preferably includes grounding busses 22 on at least the top of circuit board 20, but preferably also on the bottom (not shown) of circuit board 20. Grounding busses 22 can also be connected from the top of circuit board 20 to the bottom of circuit board 20 via additional metal along the sides of circuit board 20. The description of filter 10 up to this point is similar to the CATV filter assembly described in U.S. Pat. No. 6,794,957 incorporated herein by reference. What is different in the present invention is a split ring grounding clamp 18 consisting of a plurality of split rings which, when press fitted into housing 12, applies a uniform force along the entire contact length with grounding busses 22.

Figure 3:
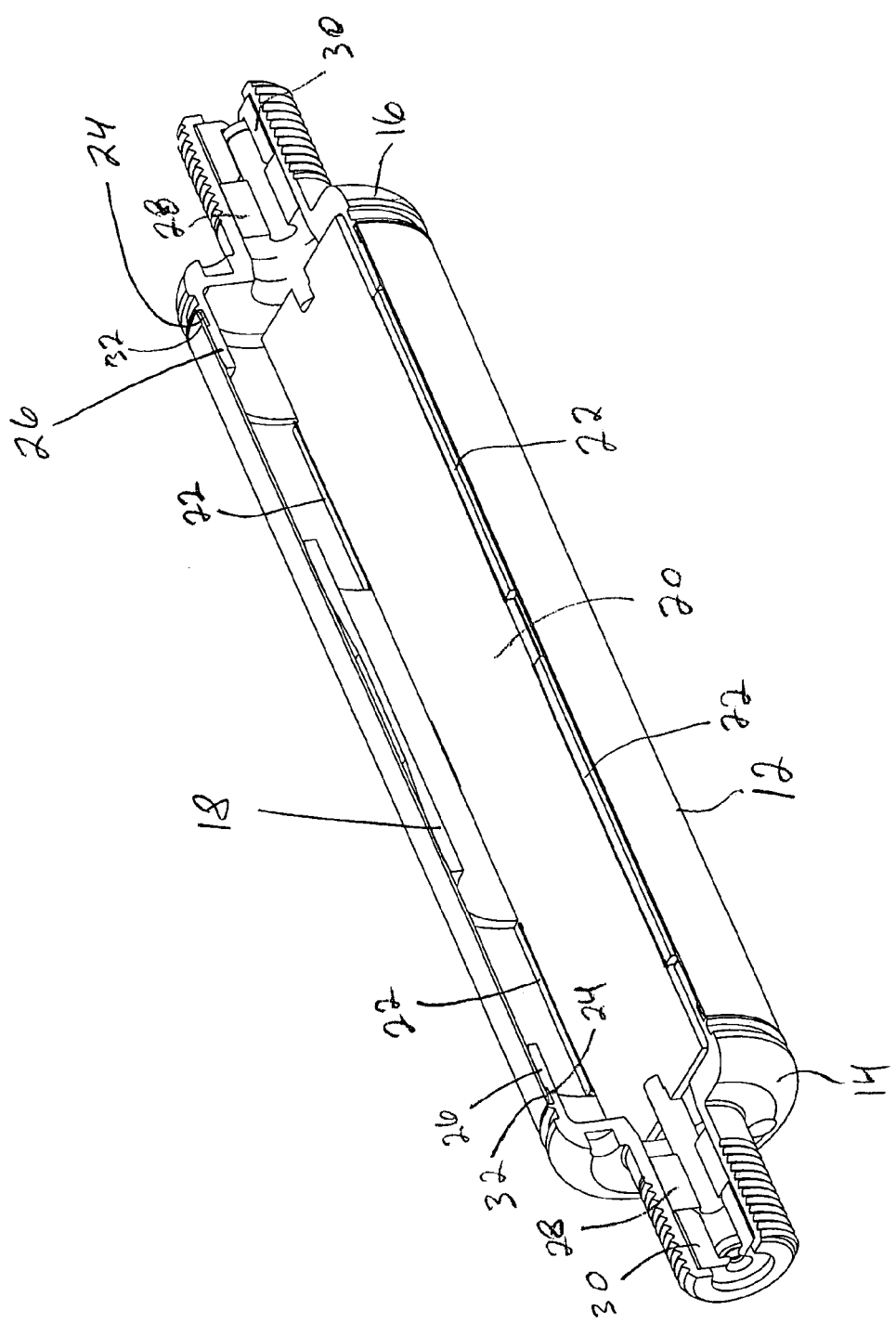
FIG. 3 shows a partially cutaway perspective view of the embodiment of FIG. 1.

Referring to FIG. 3, split ring grounding clamp 18 press-fits into housing 12, causing clamp 18 to squeeze ground busses 22 on circuit board 20. Housing 18 is preferably press-fit over each header 26 in first and second interface caps 14, 16. A ridge 32 is preferably formed on each end of housing 18 by crimp-rolling, which fits ridges 32 into grooves 24 in each header 26, thus providing an addition ground and seal.

This design of filter 10 eliminates soldering during the assembly process, as well as eliminating anti-rotational tab features, gaskets, and seals, all of which are necessary to make the embodiment as described in U.S. Pat. No. 6,794,957.

While the present invention has been described with reference to a particular preferred embodiment and the accompanying drawings, it will be understood by those skilled in the art that the invention is not limited to the preferred embodiment and that various modifications and the like could be made thereto without departing from the scope of the invention as defined in the following claims.

What is claimed is:
1. A filter for CATV applications, comprising:
a housing having open ends;
first and second interface caps attached to respective open ends of the housing;
a circuit board disposed inside the housing;

a first grounding bus printed along a top edge of the circuit board;

clamping means inside the housing for clamping a portion of the first grounding bus, thereby making electrical contact between the first grounding bus and the housing; and wherein the ends of the housing being closed off and sealed by the first and second interface caps.

2. A filter according to claim 1, wherein the clamping means comprises a split ring grounding clamp.

3. A filter according to claim 1, wherein the the housing is sealed to the first and second interface caps by a respective annular groove in a corresponding header portion of the first and second interface caps.

4. A method for making a filter for CATV applications, comprising the steps of:

providing a housing;

providing first and second interface caps, each with an annular groove in a header portion thereof;

positioning a circuit board inside the housing, wherein the circuit board includes a first grounding bus along a top edge of the circuit board;

positioning an electrically conductive split ring grounding clamp inside the housing such that a plurality of split rings are adjacent the first grounding bus;

press fitting the first and second interface caps into first and second ends of the housing, respectively, thereby forcing the plurality of split rings of the split ring grounding clamp into uniform contact with the first grounding bus; and crimp rolling the first and second ends of the housing such that a ridge is formed in the housing where the grooves in the headers are located in the first and second interface caps, thereby sealing the first and second ends of the housing to the first and second interface caps, respectively.

* * * * *